United States Patent [19]

Brewer et al.

[11] Patent Number: 5,038,201
[45] Date of Patent: Aug. 6, 1991

[54] WAFER SCALE INTEGRATED CIRCUIT APPARATUS

[75] Inventors: Joe E. Brewer, Severna Park; John J. Buckley, Jr., Hanover, both of Md.

[73] Assignee: Westinghouse Electric Corp., Pittsburgh, Pa.

[21] Appl. No.: 268,909

[22] Filed: Nov. 8, 1988

[51] Int. Cl.$^5$ ............................................. H01L 23/02
[52] U.S. Cl. ...................................... 357/81; 357/74; 357/80
[58] Field of Search ....................... 357/80, 81, 74, 75, 357/70, 72; 439/67

[56] References Cited

U.S. PATENT DOCUMENTS

| 4,076,955 | 2/1978 | Gates, Jr. ............................... 357/74 |
| 4,379,608 | 4/1983 | Olsson et al. ........................... 439/67 |
| 4,416,497 | 11/1983 | Brandsness et al. ................. 439/492 |
| 4,715,115 | 12/1987 | King et al. ............................. 357/70 |
| 4,721,995 | 1/1988 | Tanizawa ............................... 357/70 |
| 4,788,627 | 11/1988 | Ehlert et al. .......................... 357/81 |
| 4,798,541 | 1/1989 | Porter .................................... 439/67 |
| 4,867,235 | 9/1989 | Grapes et al. ......................... 357/81 |
| 4,899,208 | 2/1990 | Dietsch et al. ........................ 357/81 |
| 4,911,643 | 3/1990 | Perry et al. ............................ 439/67 |

FOREIGN PATENT DOCUMENTS 0206696 12/1986 European Pat. Off. .............. 357/75

OTHER PUBLICATIONS

Knight et al., "Electrical Connector for Flat Flexible Cable", 6-82, IBM Technical Disclosure Bulletin, vol. 25, No. 1, pp. 370-371.

Primary Examiner—Andrew J. James
Assistant Examiner—Courtney A. Bowers
Attorney, Agent, or Firm—D. Schron

[57] ABSTRACT

Wafer scale integrated circuit apparatus wherein a full wafer scale semiconductor integrated wafer is adhesively secured to an essentially flat heat conducting non-metallic base member with the wafer and base member having coefficients of thermal expansion approximately equal to one another. A cable adapter assembly connected to an edge of the base member secures one or more multiconductor flat cables in position such that the conductors thereof, by means of a clamping arrangement make positive pressure contacts with contact points connected to electronic circuitry of the semiconductor wafer. Another wafer may be placed on an opposed surface of the base member and a second cable adapter assembly may be utilized to secure another multiconductor flat cable for making interconnection between contact points of the wafer on one surface with contact points of the wafer on the opposed surface of the base member. The arrangement constitutes a wafer module and a plurality of such identical wafer modules may be stacked one upon the other and placed in a housing which has heat conducting side walls for heat dissipation purposes. A cable link assembly traverses the flat cables held in position by the first cable adapter assemblies of the wafer modules in order to serve for the inputting and outputting of electrical signals.

18 Claims, 7 Drawing Sheets

WAFER SCALE INTEGRATED CIRCUIT APPARATUS

BACKGROUND OF THE INVENTION

1. Field of the Invention

The invention in general relates to the field of integrated circuitry, and particularly, to a wafer scale circuit arrangement and the packaging therefore.

2. Background Information

In wafer scale integration, all of the electronic circuitry normally used in a given system or device may be fabricated on a large single monolithic semiconductor wafer. Wafer scale integration can potentially replace integrated circuit chips, circuit boards, and a multitude of interconnecting wires, thereby resulting in faster operating and more reliable apparatus.

Wafer scale integrated circuit devices have the potential for accommodating millions of electronic functions and therefore the inputting and outputting of signals is an important design consideration. Additionally, with millions of functions being performed on the single wafer, some wafers may generate hundreds or even thousands of watts of heat and accordingly heat removal is a primary consideration in the design of an apparatus using one or more wafer scale integrated circuits.

The present invention provides an economical packaging approach for assembly of complete devices or systems such as data and signal processors, using full silicon wafers.

SUMMARY OF THE INVENTION

Wafer scale integrated circuit apparatus is provided which includes at least one semiconductor wafer having defined therein electronic circuitry as well as a plurality of contact points electrically connected to the electronic circuitry.

The semiconductor wafer is secured, such as by adhesive, to an essentially flat, heat conducting base member having first and second opposed surfaces and operable not only to support the semiconductor wafer but to conduct heat therefrom during operation. The semiconductor wafer and base member have coefficients of thermal expansion approximately equal to one another. In another embodiment a second similar semiconductor wafer is secured to an opposed surface of the base member.

A multiconductor flat cable has predetermined conductors thereof in electrical contact with selected ones of the contact points of the semiconductor wafer and a multiconductor cable link is provided to make connection with the conductors of the flat cable for inputting and outputting of electrical signals.

Each wafer may include at least one multiconductor flat cable for connection with the cable link and in addition, a multiconductor flat cable wraps around an edge of the base member to make electrical connection between the contact points of the semiconductor wafers on either side of the base member. All of the flat cables are held in position by means of cable adapter assemblies which are affixed to the base member and are operable to mechanically secure the flat cable to insure that electrical contact of its conductors are made with the contact points. For this purpose a clamp means provides a clamping force to the cable through the intervening medium of an elastomeric material.

The wafer structure described constitutes a wafer module and a plurality of modules may be provided which are electrically linked together to outside sensor or utilization devices by means of a cable link assembly. A stack of the wafer modules are collectively disposed within a housing having heat conducting sidewalls in heat transfer relationship with the base members of the wafer modules for heat removal purposes.

DESCRIPTION OF THE PREFERRED EMBODIMENTS

Figure 1:
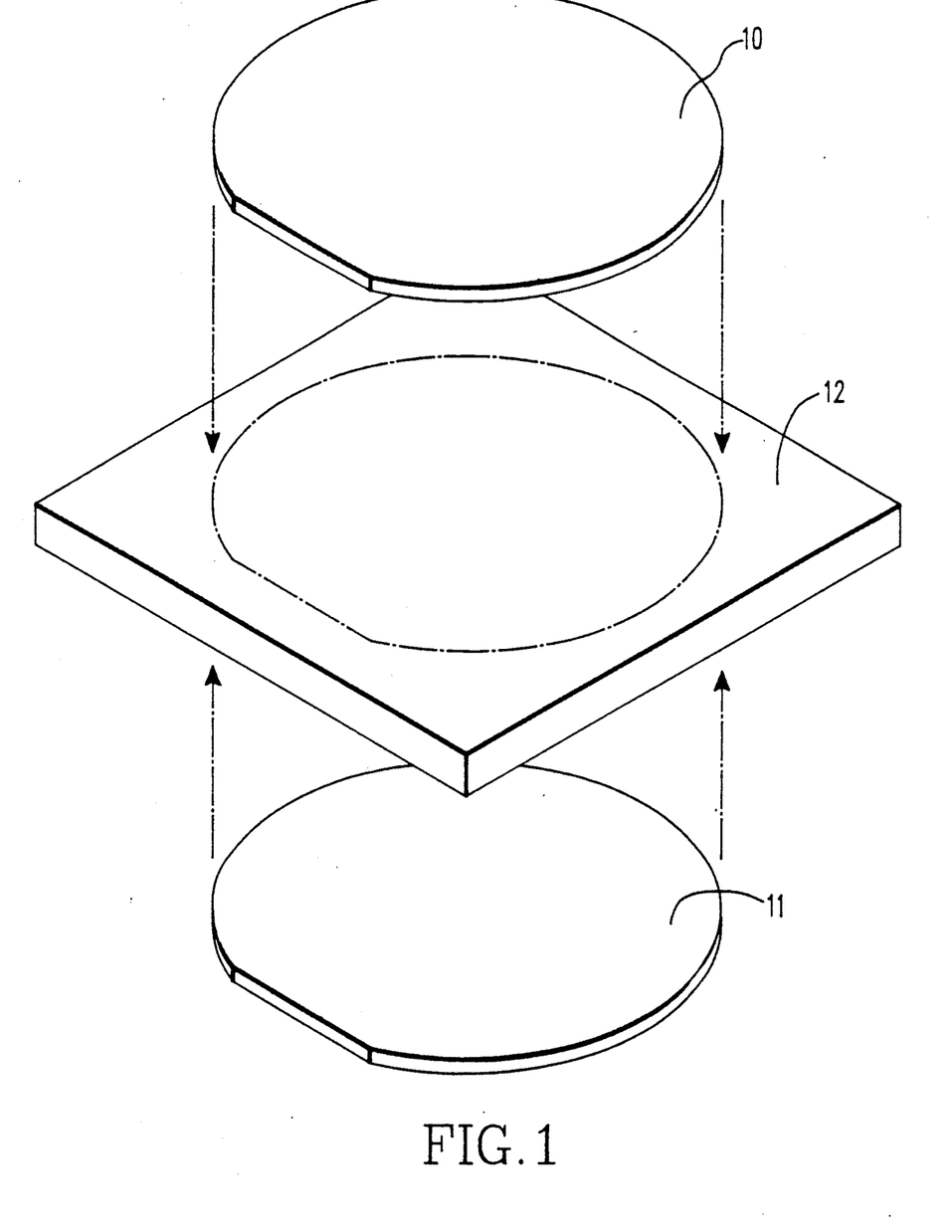
FIG. 1 illustrates an exploded view of two wafer scale integrated circuits in relation to a base member, in accordance with one embodiment of the present invention.

As illustrated in FIG. 1, in one embodiment of the present invention, first and second full wafer scale semiconductor integrated wafers 10 and 11 are disposed upon opposed surfaces of an essentially flat, heat conducting base member 12.

The base member 12 is of a non-metallic, heat conducting material and functions as a heat sink for removing heat generated during normal operation, as well as a structural support for the wafers. The base member 12 is made of carbon/graphite fibers, such as graphite fiber P-100-2k, in an epoxy matrix such as ERL-1962, both products being manufactured by the Amoco Performance Products. The fibers are highly conductive along their longitudinal axis and the composite fiber-epoxy is fabricated using a cross-ply laminated pattern which not only provides a high resistance to bending but also allows the coefficient of thermal expansion of the base member to be tailored to substantially match that of the semiconductor wafers 10 and 11 so as to minimize thermally induced stresses. The composite base member 12 exhibits a higher heat conductivity than that of an equivalent sized aluminum base member and would be approximately 35% lighter in weight than aluminum.

The coefficient of thermal expansion of a typical silicon semiconductor wafer is approximately $2.6 \times 10^{-6}/°C$. In view of the cross-ply laminated pattern of the elongated carbon/graphite fibers, the coefficient of thermal expansion of the composite base member is directional and can be established by design. By way of example, utilizing the above materials, a composite base member was fabricated with a coefficient of thermal expansion of $-0.963 \times 10^{-6}/°C$. in a first, or x direction and a coefficient of thermal expansion of $3.623 \times 10^{-6}/°C$. in a second, or y direction. When compared with the silicon wafer, the differences are 3.563 and 1.02 respectively. By comparison, the difference between the coefficients of thermal expansion of silicon and an aluminum base (CTE≈28.6×10⁻⁶/°C.) would be approximately 26.

In order to reduce any stresses which may be induced in the semiconductor wafers 10 and 11 due to any small difference in coefficient of thermal expansions between the wafers and base member, the wafers are preferably secured to the base member by means of a resilient adhesive film such as Dow Corning Q3-6605.

Figure 2:
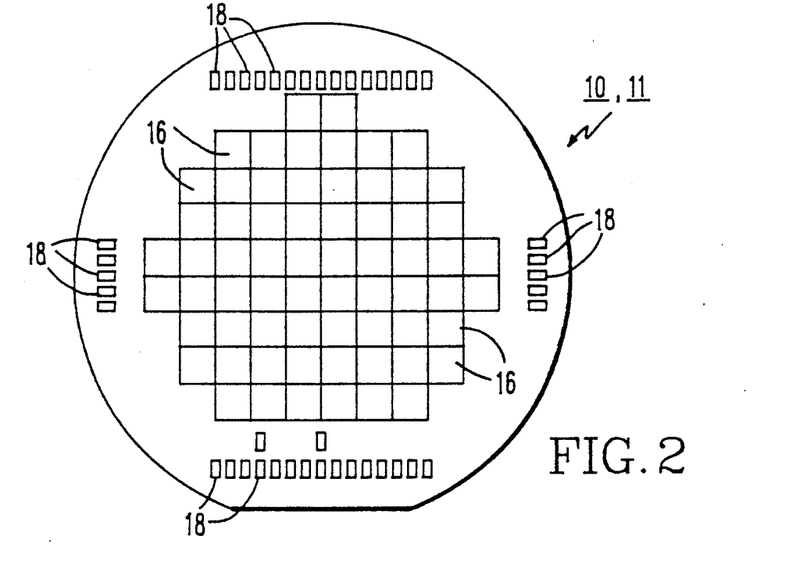
FIG. 2 illustrates a wafer scale integrated circuit showing electronic circuit sites and contact points.

A typical wafer scale semiconductor wafer 10/11 as illustrated in FIG. 2, includes electronic circuitry for performing electronic functions and the electronic circuitry may be defined at a plurality of sites 16 with electrical connection between different sites being facilitated by a plurality of metallization levels normally provided during wafer manufacture. The wafer includes a plurality of contact points 18 which are electrically connected to the electronic circuitry of the wafer and are utilized not only for the application of operating potential, but for the conduction of signals to and from the wafer.

Figure 3:
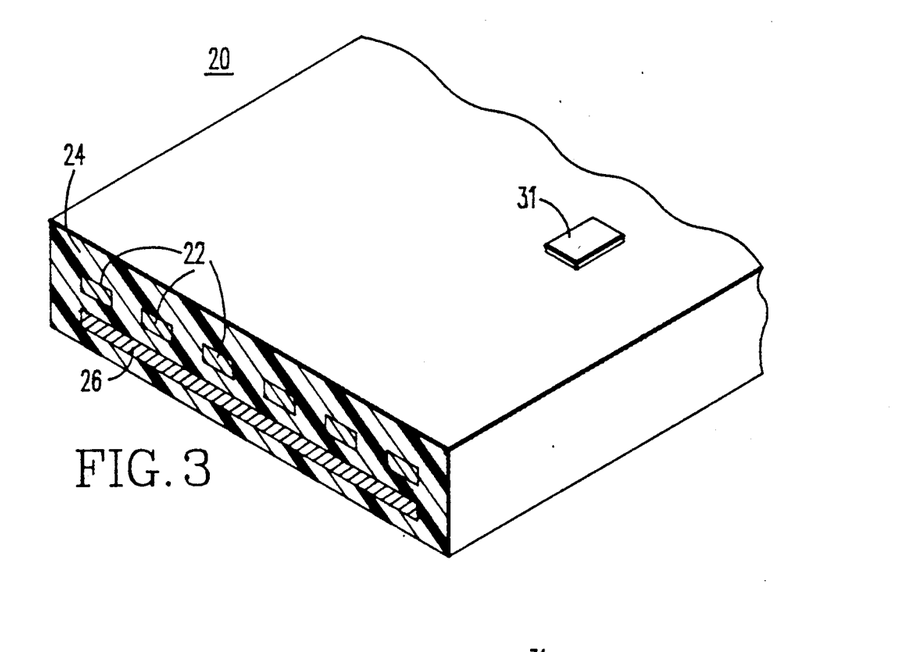
FIG. 3 is an isometric view and FIG. 4 is a longitudinal cross section of a preferred multiconductor cable utilized herein.

In the present invention, the inputting and outputting of these signals is accomplished with a thin, flat multiconductor cable 20 such as illustrated in FIG. 3. The flat cable 20 is a commercially available product which can be designed for specific electrical characteristics such as impedance, inductance, capacitance, crosstalk, attenuation, distortion and rise and fall times. The cable as illustrated in FIG. 3 includes a plurality of spaced electrical conductors 22 embedded in a flexible dielectric material 24. The cable may also include one or more ground planes or shields 26, with the arrangement being such that the transmission characteristics of these devices may be specifically tailored for a particular function. These cables may be mated to other cables or rigid transmission lines without disturbing the characteristic impedance level associated with the transmission line.

Figure 4:
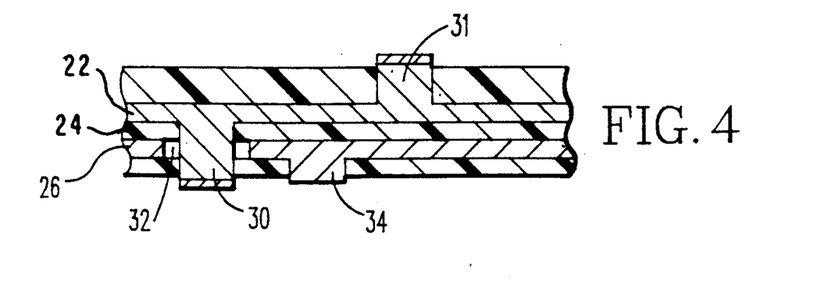

In the present invention, conductors 22 make pressure contact directly with the contact points of the semiconductor wafer and to this end, as illustrated in FIG. 4, an electrically conducting gold tipped pedestal 30 is integral with a particular conductor 22 and extends to the bottom of the dielectric material for making electrical contact. These electrically conducting pedestals also are operable to extend from a conductor to the top surface of the dielectric as indicated by pedestal 31. When extending to the bottom surface, the pedestal 30 projects through an aperture 32 in the ground plane 26 which itself may include one or more electrically conducting pedestals 34.

Figure 5:
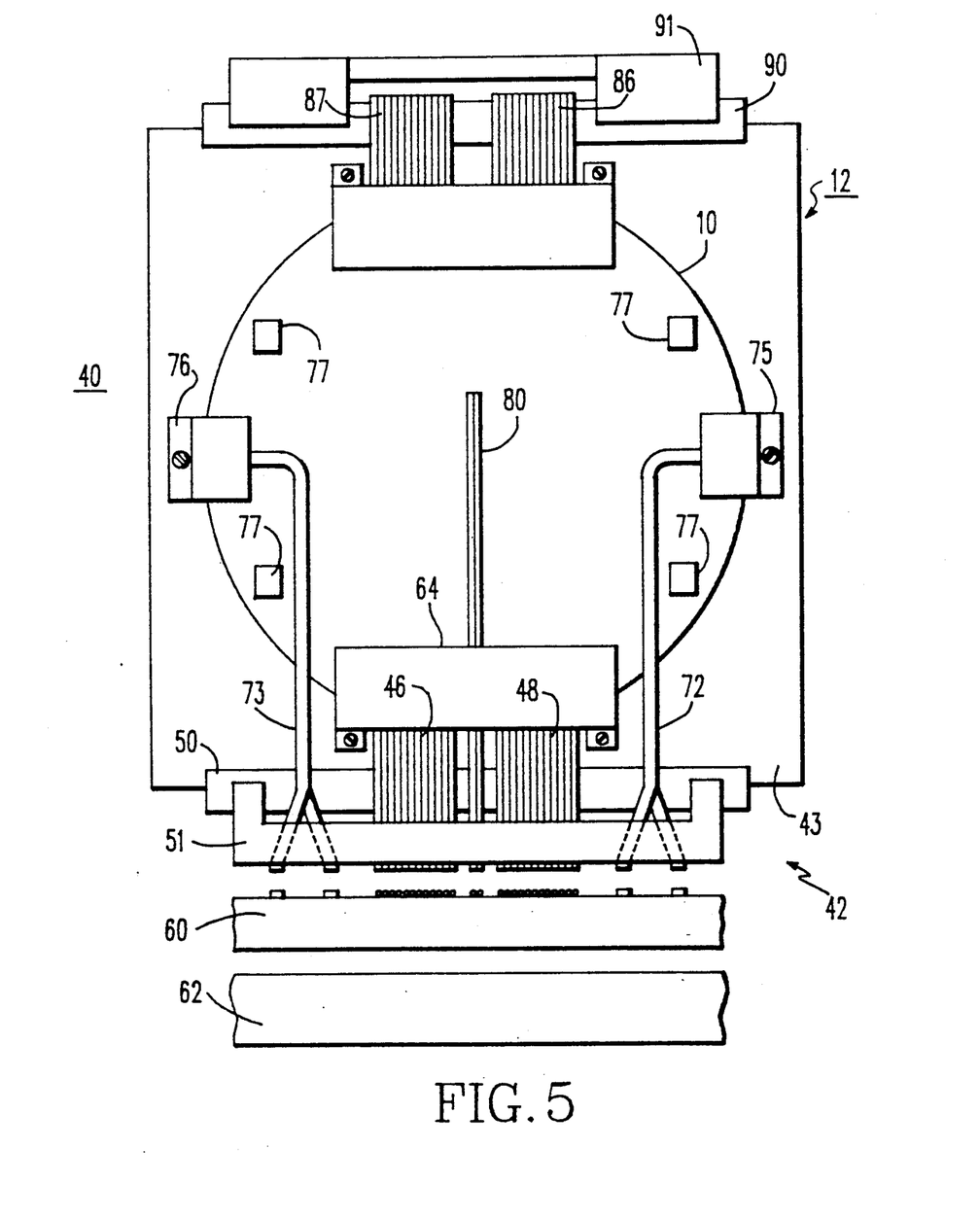
FIG. 5 is a plan view and FIG. 6 is an isometric view, with portions cut away, of a preferred embodiment of the present invention.
Figure 6:
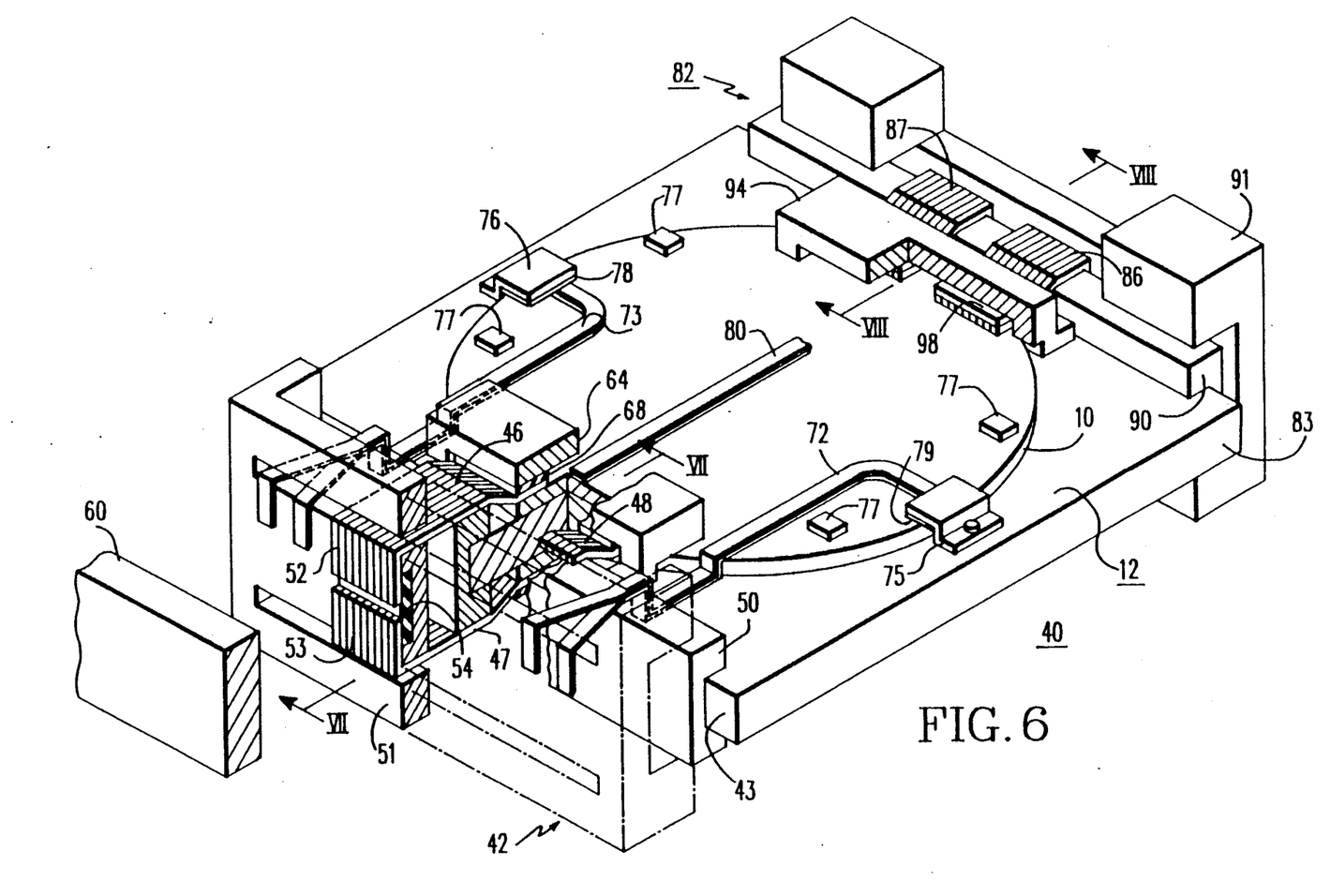
Figure 7:
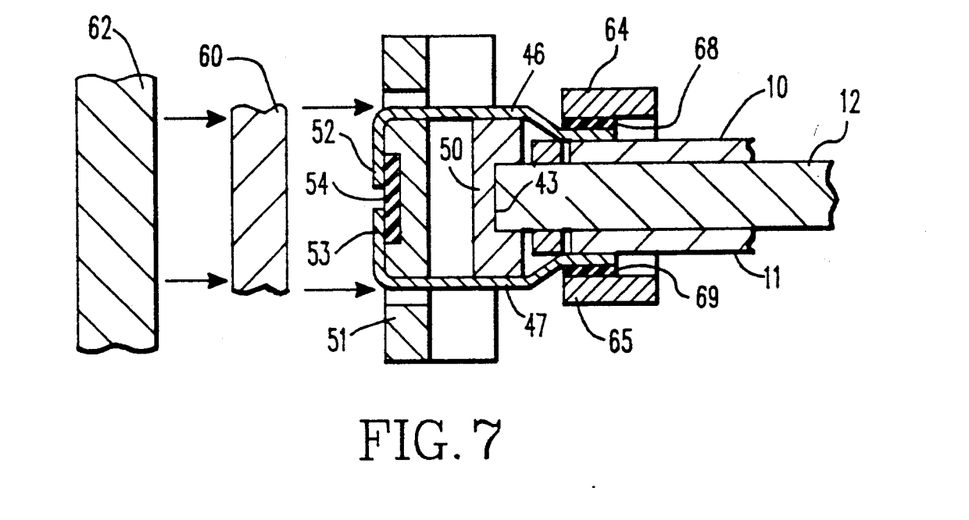
FIGS. 7 and 8 are isolated sectional views of a portion of the apparatus illustrated in FIGS. 5 and 6.

FIG. 5 illustrates a plan view and FIG. 6 an isometric view, with portions cut away, of a wafer module 40 which includes base member 12 having semiconductor wafers secured to opposed surfaces thereof as previously described. Module 40 includes a first cable adapter assembly 42 connected to an edge 43 of rectangular base member 12 and operable to mechanically secure cables such as illustrated in FIG. 3 in relation to the semiconductor wafer to insure for electrical contact of the conductors of the cable directly with the contact points of the semiconductor wafer. At least one flat cable 46 is provided for electrical connection with semiconductor wafer 10 while at least one flat cable 47 is provided for making an electrical connection with semiconductor wafer 11 as further illustrated in FIG. 7 which is a view generally along the line VII-VII of FIG. 6. Additional flat cables may be provided and a portion of one such cable, 48, connected to wafer 10 may be seen in FIGS. 5 and 6.

Cables 46 and 47 pass over a first C-shaped structure 50 and through a second generally C-shaped structure 51 of cable adapter assembly 42 and have their ends disposed on an elastomeric insert 54 carried by structure 51. In order to provide for the inputting and outputting of electrical signals to the semiconductor wafers 10 and 11, there is provided a cable link assembly 60 having a plurality of conductors and being positioned adjacent the ends 52 and 53 of cables 46 and 47 with selected conductors of the cable link assembly 60 being exposed so as to make electrical contact with predetermined conductors via appropriate conducting pedestals connected to the conductors of the flat cables. A longitudinal structural member 62 may be fastened to structure 51 such that with the provision of elastomeric insert 54, positive pressure contact is made between the appropriate conductors of cable link assembly 60 and cables 46 and 47.

Pressure contacts are also made between the conductors of cables 46 and 47 with appropriate contact points of wafers 10 and, 11 by means of respective clamps 64 and 65 secured to opposed surfaces of base member 12. The clamp arrangement includes elastomeric inserts 68 and 69 to provide a positive spring pressure.

In a high speed high density device as illustrated, power distribution is an important concern. From the point of view of crosstalk and power dissipation it is desirable to operate the high speed circuitry at relatively low voltages. This low voltage requirement however places severe demands on a power distribution system since even small voltage drops in the power and ground leads may add up to adversely affect the signal to noise ratio. For power distribution a low resistance, low inductance cable is required.

In a preferred embodiment of the invention power entry to the wafers is by dedicated power conductors separate from signal conducting flat cables such as indicated by numerals 46 to 48.

To this end the first cable adapter assembly 42 may also be operable to support these power conductors which take the form of flat low resistance, low inductance cables 72 and 73. The cables 72 and 73 may include overlapping power and ground lines suitably insulated from one another. The cables extend over the wafer 10 in the regions around the periphery of the electronic circuitry defined in the wafer and are coupled to the contact points or metallization layers by means of respective clamps 75 and 76 both of which include a respective elastomeric insert 78 and 79 for positive pressure contact. The cables 72 and 73 additionally extend through, and are secured by, cable adapter assembly 42 where the ribbon-like power and ground leads are separated so as to make contact with respective power and ground lines carried by the cable link assembly 60. Decoupling capacitors 77 adhesively secured to the wafer make electrical contact with power and ground lines in order to reduce transient currents.

FIGS. 5 and 6 additionally show a single multiconductor flat cable 80 which extends over the surface of wafer 10 and which is operable to make electrical contact with the electronic circuitry of the wafer by way of the metallization layers of the semiconductor wafer. The cable 80 serves to illustrate that not all of the electronic signals need be inputted or outputted at the edge of a wafer.

In a preferred embodiment, means are provided for allowing signal communication between the wafer on one surface of the base member 12 and the wafer on the other surface of the base member 12 without necessarily using a cable link assembly such as 60. To this end, there is provided a second cable adapter assembly 82 connected to edge 83 of base member 12 for structurally maintaining and positioning at least another multiconductor flat cable 86 which, as further illustrated in FIG. 8, electrically connects semiconductor wafer 10 with semiconductor wafer 11. One or more multiconductor flat cables may be utilized and the figures illustrate an additional flat cable designated by the numeral 87.

Figure 8:
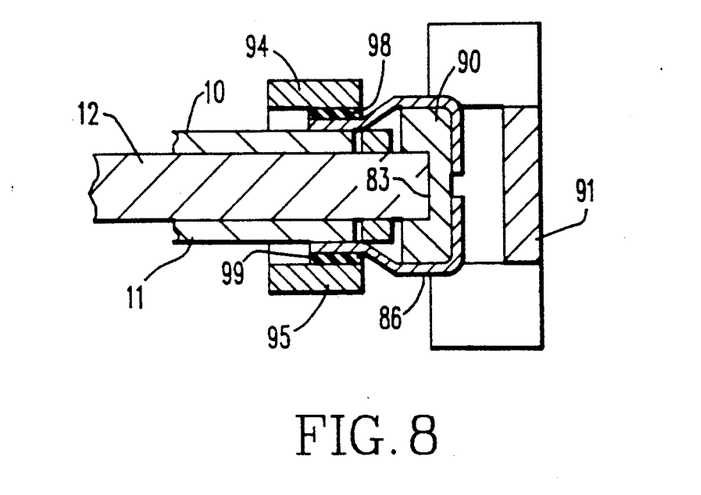

Cable 86 in essence makes a 180° turn around C-shaped structure 90 secured to edge 83 and is protected by another essentially C-shaped structure 91.

Positive contact is made between the conductors of the cable 86 with the contact points of the semiconductor wafers by means of the arrangement which includes respective clamps 94 and 95 secured to base member 12 and which apply pressure to the cables by way of respective elastomeric inserts 98 and 99.

Figure 9:
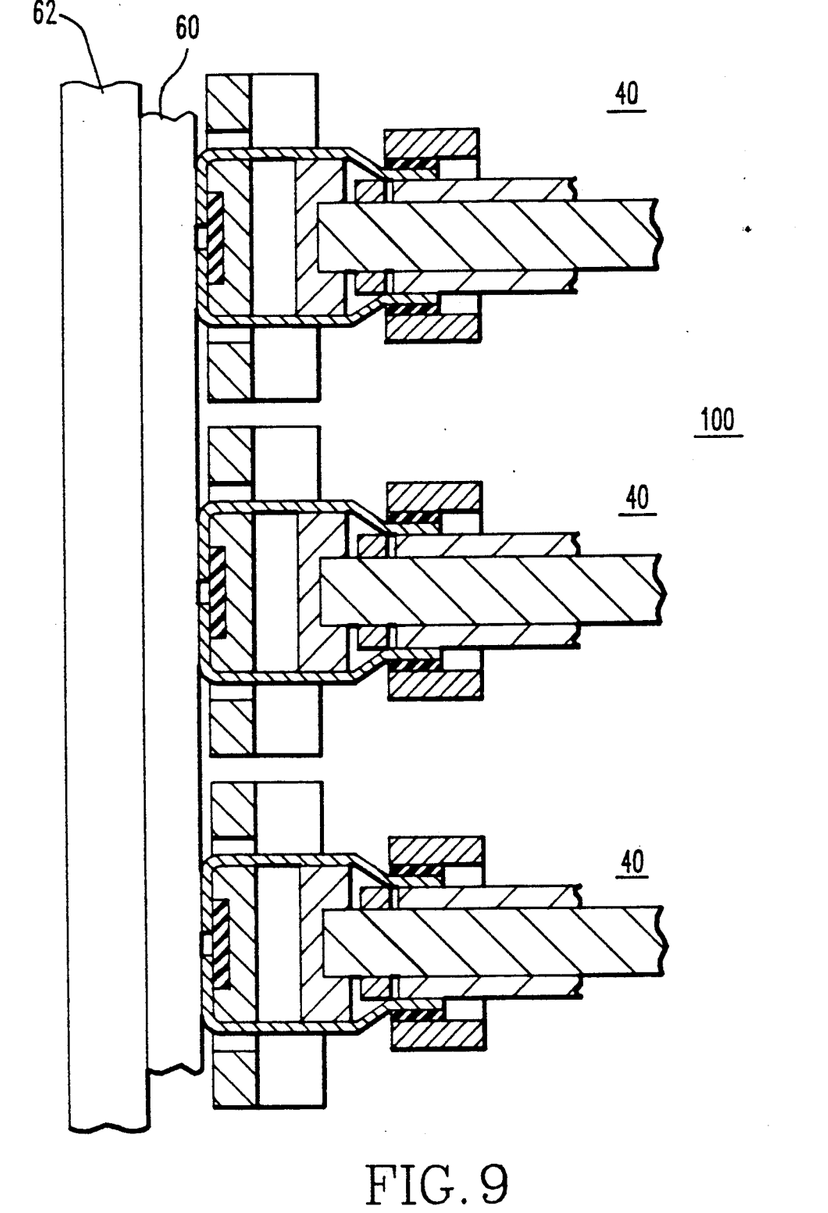
FIG. 9 illustrates a multistack arrangement.

The wafer module 40 may constitute a complete electronic circuit which may then be placed in a housing for protection and heat removal purposes. Alternatively, and as illustrated in FIG. 9, a plurality of wafer modules 40 may be stacked one upon the other to constitute a wafer stack assembly 100 with the individual modules 40 thereof being in signal transfer relationship with the cable link assembly 60.

Figure 10:
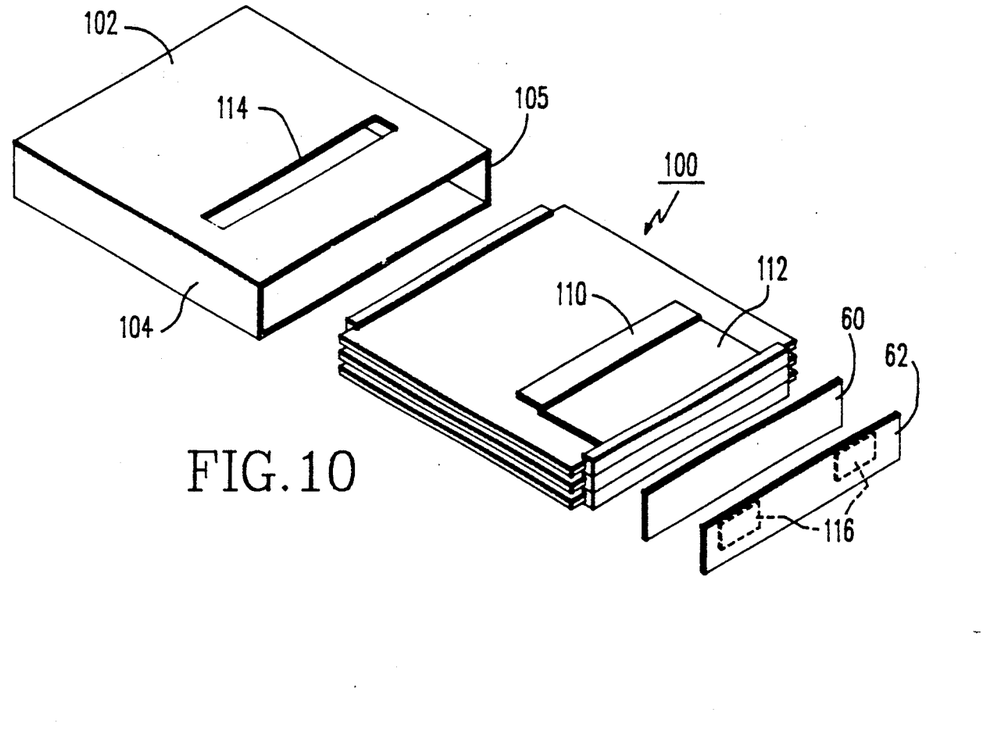
FIG. 10 illustrates an exploded view of a complete wafer scale package.

With additional reference to FIG. 10, the wafer stack assembly 100 is placed within a housing 102 the side walls of which, 104 and 105, are heat conducting and function as a heat sink in thermal contact with all of the free edges of the base members of the modules constituting the wafer stack assembly 100. After insertion of the wafer stack assembly 100 into housing 102, longitudinal structural member 62 may then be secured in place to act as a housing cover.

Electrical communication with the electronic circuitry defined in the semiconductor wafers may be accomplished by means of a connector assembly 110 electrically connected to a multiconductor flat cable 112 which makes the necessary connections with predetermined conductors of the cable link assembly 60. When in an assembled condition, electrical connection to the connector assembly 110 may be accomplished by means of an aperture 114 in the housing 102. Alternatively, a connector assembly 116 may be mounted on the cover 62 with through connections to individual conductors of the cable link assembly 60.

Figure 11:
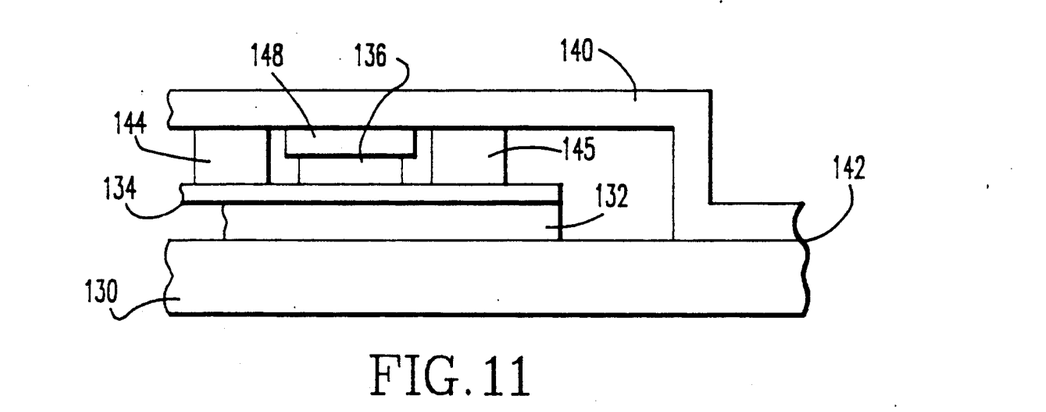
FIG. 11 is a view illustrating another embodiment of the present invention.

FIG. 11 illustrates another embodiment of the present invention and includes an essentially flat heat conducting base member 130 having a full wafer scale semiconductor wafer 132 adhesively secured thereto, as previously described. The large surface area of semiconductor wafer 132 is covered by a multiconductor flat cable 134 which contains several interconnect layers. The conductors of cable 134 are connected to the semiconductor wafer 132 at a plurality of different points over the surface by pressure contacts. Cable 134 serves as a mounting surface for one or more very large scale integrated circuit chips 136 which may be adhesively secured in position and which makes signal and power connections to predetermined conductors of cable 134. The chip 136 may be utilized in a package support or in bare chip form.

The entire assembly is secured in place by means of a top clamp 140 which is thermally conductive and makes thermal contact with base member 130 as indicated by numeral 142 and pressure is applied to the cable 134 through the medium of elastomeric spacers 144 and 145.

If chip 136 produces relatively little heat during operation, such heat can be accommodated through cable 134, wafer 132 and the heat conducting base member 130 which has a high thermal conductivity. If, however, the chip 136 produces excessive heat during operation, the basic heat flow arrangement may be augmented by the provision of a commercially available heat transfer device 148 which contacts the integrated circuit chip 136 and is operable to transfer the heat generated therefrom to the heat conducting clamp member 140.

The embodiment of FIG. 11 therefore provides for a combination of large scale integrated circuit devices with wafer scale integrated circuit devices and the arrangement provides very short signal paths between the devices as well as good heat transfer and mechanical strength.

We claim:

1. Wafer scale integrated circuit apparatus comprising:
   A) a semiconductor wafer having defined therein electronic circuitry for performing electronic functions;
   B) said semiconductor wafer including a plurality of contact points electrically connected to said electronic circuitry;
   C) an essentially flat, heat conducting base member having first and second surfaces;
   D) said semiconductor wafer being secured to said base member on said first surface thereof, said member being operable to not only support said semiconductor wafer but to conduct heat therefrom during operation;
   E) said semiconductor wafer and said base member having coefficients of thermal expansion approximately equal to one another;
   F) a multiconductor flat cable having predetermined conductors in electrical contact with predetermined ones of said contact points of said semiconductor wafer;
   G) a cable adapter assembly secured to said base member and operable to mechanically secure said flat cable in relation to said semiconductor wafer to insure said electrical contact of said conductors with said contact points; and
   H) another multiconductor flat cable held in position by said cable adapter assembly and extending over a portion of the surface of said semiconductor wafer and particularly over the electronic circuitry define therein and positioned to make electrical contact directly with said electronic circuitry.

2. Apparatus according to claim 1 wherein:
   A) said base member is non-metallic.

3. Apparatus according to claim 1 wherein:
   A) said semiconductor wafer is adhesively secured to said base member by means of a resilient adhesive.

4. Apparatus according to claim 2 wherein:
   A) said semiconductor wafer is adhesively secured to said base member by means of a resilient adhesive.

5. Apparatus according to claim 1 wherein:
   A) said cable adapter assembly includes clamping means having an elastomeric insert directly contacting said flat cable and operable to apply a positive pressure to maintain electrical contact between said conductors and said contact points.

6. Wafer scale integrated circuit apparatus comprising:
A) first and second semiconductor wafers each having define therein electronic circuitry for performing electronic functions;
B) each said semiconductor wafer including a plurality of contact points electrically connected to said electronic circuitry;
C) an essentially flat, heat conducting base member having first and second opposed parallel surfaces;
D) said first semiconductor wafer being secured to said base member on said first surface thereof;
E) said second semiconductor wafer being secured to said base member on said second surface thereof;
F) said base member being operable to not only support said semiconductor wafers but to conduct heat therefrom during operation;
G) said semiconductor wafers and said base member having coefficients of thermal expansion approximately equal to one another;
H) a first multiconductor flat cable having predetermined conductors in electrical contact with predetermined ones of said contact points of said first semiconductor wafer;
I) a second multiconductor flat cable having predetermined conductors in electrical contact with predetermined ones of said contact points of said second semiconductor wafer;
J) a first cable adapter assembly secured to a first edge of said base member and operable to mechanically secure both said first and second flat cables in respective relation to said first and second semiconductor wafers to insure said electrical contact of said conductors with said contact points;
K) a second cable adapter assembly secured to an edge of said base member and
L) at least one other multiconductor flat cable secured in position by said second cable adapter assembly such that said other flat cable wraps around the edge of said base member and predetermined conductors of said other cable electrically connect predetermined contact points of said first semiconductor wafer with predetermined contact points of said second semiconductor wafer.

7. Apparatus according to claim 6 wherein:
A) said base member is rectangular;
B) said first and second cable adapter assemblies are respectively secured to opposite edges of said base member.

8. Apparatus according to claim 6 which includes:
A) a cable link assembly having a plurality of conductors and positioned adjacent said first and second flat cables with selected conductors of said cable link assembly making electrical contact with the conductors of said first and second flat cables so as to allow for inputting and outputting of electrical signals to said semiconductor wafers.

9. Apparatus according to claim 7 which includes:
A) a housing having heat conducting side walls;
B) said base member being inserted in said housing in a manner that the two edges of said base member to which said cable adaptor assemblies are not secured are in heat conducting contact with said heat conducting side walls.

10. Wafer scale integrated circuit apparatus comprising:
A) a plurality of wafer modules, each said module comprising;
i) first and second semiconductor wafers each having defined therein electronic circuitry for performing electronic functions;
ii) each said semiconductor wafer including a plurality of contact points electrically connected to said electronic circuitry;
iii) an essentially flat, heat conducting base member having first and second opposed parallel surfaces;
iv) said first semiconductor wafer being secured to said base member on said first surface thereof;
v) said second semiconductor wafer being secured to said base member on said second surface thereof;
vi) said base member being operable to not only support said semiconductor wafers but to conduct heat therefrom during operation;
vii) said semiconductor wafers and said base member having coefficients of thermal expansion approximately equal to one another;
viii) a first multiconductor flat cable having predetermined conductors in electrical contact with predetermined ones of said contact points of said first semiconductor wafer and
ix) a second multiconductor flat cable having predetermined conductors in electrical contact with predetermined ones of said contact points of said second semiconductor wafer;
B) a housing having heat conducting side walls;
C) said plurality of wafer modules being stacked one upon another and being collectively disposed within said housing such that said heat conducting base members of said wafer modules are in heat transfer relationship with said side walls; and
D) means for inputting and outputting electrical signals to said stacked wafer modules.

11. Apparatus according to claim 10 wherein:
A) each said wafer module includes:
i) a first cable adapter assembly secured to a first edge of said base member and operable to mechanically secure both said first and second flat cables in respective relation to said first and second semiconductor wafers to insure said electrical contact of said conductors with said contact points.

12. Apparatus according to claim 11 wherein:
A) each said wafer module includes:
i) a second cable adapter assembly secured to an edge of said base member;
ii) at least one other multiconductor flat cable secured in position by said second cable adapter assembly such that said other flat cable wraps around the edge of said base member and predetermined conductors of said other cable electrically connect predetermined contact points of said first semiconductor wafer with predetermined contact points of said second semiconductor wafer.

13. Apparatus according to claim 12 wherein:
A) said base member is rectangular;
B) said first and second cable adapter assemblies are respectively secured to opposite edges of said base member.

14. Apparatus according to claim 13 wherein:
A) said means for inputting and outputting includes;

i) a cable link assembly having a plurality of conductors and positioned adjacent said first and second flat cables of said plurality of wafer modules with selected conductors of said cable link assembly making electrical contact with selected conductors of said first and second flat cables.

15. Wafer scale integrated circuit apparatus comprising:
   A) a semiconductor wafer having defined therein electronic circuitry for performing electronic functions;
   B) said semiconductor wafer including a plurality of contact points electrically connected to said electronic circuitry;
   C) an essentially flat, heat conducting base member having first and second surfaces;
   D) said semiconductor wafer being secured to said base member on said first surface thereof, said member being operable to not only support said semiconductor wafer but to conduct heat therefrom during operation;
   E) said semiconductor wafer and said base member having coefficients of thermal expansion approximately equal to one another;
   F) a multiconductor flat cable having predetermined conductors in electrical contact with predetermined ones of said contact points of said semiconductor wafer;
   G) an additional multiconductor flat cable which extends over the surface of said semiconductor wafer and makes electrical connection with said electronic circuitry;
   H) an integrated circuit chip device positioned on top of said additional flat cable and having leads in electrical contact with conductors of said additional flat cable; and
   I) clamp means for maintaining said integrated circuit device in position on said additional flat cable.

16. Apparatus according to claim 15 wherein:
   A) said clamp means is heat conducting and in thermal contact with said base member.

17. Apparatus according to claim 16 which includes:
   A) a heat conducting device positioned between and in contact with both said integrated circuit device and said clamp means.

18. Apparatus according to claims 6, 10, or 15 wherein:
   A) said base member is comprised of a plurality of carbon/graphite fibers in an epoxy matrix and fabricated in a cross-ply laminated pattern.

* * * * *